(12) United States Patent
Hung et al.

(10) Patent No.: US 6,476,469 B2
(45) Date of Patent: Nov. 5, 2002

(54) QUAD FLAT NON-LEADED PACKAGE STRUCTURE FOR HOUSING CMOS SENSOR

(75) Inventors: Chin-Yuan Hung, Taichung Hsien (TW); Lien-Chen Chiang, Taichung (TW); Cheng-Shiu Hsiao, Nantou (TW)

(73) Assignee: Siliconware Precision Industries Co., Ltd., Taichung Hsien (TW)

( * ) Notice: Subject to any disclaimer, the term of this patent is extended or adjusted under 35 U.S.C. 154(b) by 0 days.

(21) Appl. No.: 09/842,040

(22) Filed: Apr. 25, 2001

(65) Prior Publication Data
US 2002/0060357 A1 May 23, 2002

(30) Foreign Application Priority Data
Nov. 23, 2000 (TW) .......................................... 89220337

(51) Int. Cl.[7] ............................................. H01L 23/495
(52) U.S. Cl. ....................... 257/676; 257/666; 257/642; 257/680
(58) Field of Search ................................. 257/676, 666, 257/642, 643, 680

(56) References Cited
U.S. PATENT DOCUMENTS

| | | |
|---|---|---|
| 5,270,491 A | 12/1993 | Carnall, Jr. et al. |
| 5,529,959 A | 6/1996 | Yamanaka |
| 5,811,799 A | 9/1998 | Wu |
| 5,898,218 A | 4/1999 | Hirose et al. |
| 6,303,978 B1 * | 10/2001 | Daniels et al. ............... 257/642 |
| 6,191,359 B1 * | 2/2002 | Sengupta .................... 174/52.3 |
| 6,208,020 B1 * | 3/2002 | Minamio et al. ............ 257/684 |
| 6,355,502 B1 * | 3/2002 | Kang et al. .................. 438/110 |

* cited by examiner

*Primary Examiner*—Richard Elms
*Assistant Examiner*—Brad Smith
(74) *Attorney, Agent, or Firm*—J.C. Patents

(57) ABSTRACT

A quad flat non-leaded package structure for housing a sensor. The package includes a die pad, a plurality of leads, a die, a plurality of bonding wires, a packaging plastic body and a lid cover. A plurality of supporters are formed near the edges on the backside of the die pad. The plurality of leads is positioned at a well-defined distance away from the four sides of the die pad. The packaging plastic body is formed on the upper surface near the peripheral section of the leads. The space between the die pad and the leads is filled by the packaging plastic material but the bottom section of the leads and the bottom section of the supporters on the backside of the die pad are exposed. The die is attached to the upper surface of the die pad and is electrically connected to the leads using the bonding wires. The lid cover is placed over the packaging plastic body.

13 Claims, 3 Drawing Sheets

QUAD FLAT NON-LEADED PACKAGE STRUCTURE FOR HOUSING CMOS SENSOR

CROSS-REFERENCE TO RELATED APPLICATION

This application claims the priority benefit of Taiwan application serial no. 89220337, filed Nov. 23, 2000.

BACKGROUND OF THE INVENTION

1. Field of Invention

The present invention relates to a quad flat non-leaded package structure for housing a sensor. More particularly, the present invention relates to a quad flat non-leaded package structure for housing a complementary metal-oxide-semiconductor (CMOS) sensor.

2. Description of Related Art

Due to the rapid development in multi-media technologies, digital images are used more frequently. Consequently, the demand for image processing devices is increasing. Currently, many digital image products, including computerized digital video cameras, digital cameras, optical scanners and image telephones utilize an image sensor to capture images. Image sensors generally belong to either the charge coupled device type or the complementary metal-oxide-semiconductor (CMOS) sensor type. Both types of sensors are sensitive to light and can easily convert light signals into digital signals. Since image sensors need to function in the presence of light, the packaging structure is, by convention, different from the packaging structure of most electronic products.

A conventional CMOS sensor is generally packaged inside a ceramic body such as a ceramic leadless chip carrier (CLCC). Since ceramic material has good thermal conductivity and moisture prevention capability, electronic products that demand great reliability, such as industrial products or military components, are generally enclosed inside a ceramic package. Due to rapid progress in the electronic industry, sensors now have an increasing number of applications. However, consumer products using a ceramic package have a high production cost, which is a big drawback for the production of consumer products. In general, consumer products do not require very high reliability, which is why most consumer products are currently enclosed by plastic. Due to the pressure of competition in the market, any means of lowering the packaging cost of a sensor and yet maintaining a certain level of quality and reliability is valuable.

For example, in U.S. Pat. No. 5,523,608 and U.S. Pat. No. 5,529,959, an image sensor packaged inside a plastic quad flat package (PQFP) is disclosed. However, due to the occupation of a great volume by the package, the design is unsuitable for manufacturing future generations of highly integrated packages. To obtain a longer working life and a better sealing, some image sensors are fabricated using a ceramic carrier. Methods of manufacturing a ceramic leadless chip carrier (CLCC) are disclosed in U.S. Pat. Nos. 5,898,218 and 5,270,491. However, the packages are generally expensive and difficult to manufacture. An image sensor can also be encapsulated inside a plastic package using a laminated substrate to serve as a carrier as disclosed in U.S. Pat. No. 5,811,799. Here, a package similar to a leadless carrier but occupying a relatively small volume is produced. Nevertheless, the material for forming the carrier substrate, such as flame-retardant epoxy-glass fabric composite resin (FR-4, FR-5) or bismaleimide-triazine (BT), is quite expensive. Ultimately, this type of package is expensive to produce and weak in market competition.

FIG. 1 is a schematic cross-sectional view of a conventional CMOS sensor package. As shown in FIG. 1, the quad flat non-leaded package includes a lead frame substrate or chip carrier 102, a die pad 104 and a plurality of leads 106. Around the die pad 104 and near the bonding portion or finger of the leads 106, a step structure 116 is formed so that a portion of the thickness is reduced. The package is fabricated in several stages. First, a mold compound 114 is put on the surface 101 of the chip carrier 102 close to the sides, and between the die pad 104 and the leads 106. A die 110 is attached to the die pad 104 by adhesive 108. A wire-bonding step is carried out to connect the die 110 with the leads 106 electrically by bonding wires 112. Finally, a transparent lid 118 is put over the mold compound 114.

Although the step structure 116, which is close to the bonding portion of the leads 106 and around the die pad 104, facilitates engagement between the chip carrier 102 and the mold compound 114, cracks are easily formed around the die pad 104. Since the peripheral portion of the die pad 104 may contact with the outside atmosphere via the step structure 116 if there are any cracks, moisture may easily penetrate into the package. In addition, when insufficient mold compound 114 is inserted into the gap between the die pad 104 and the leads 106, the die pad 104 will be enclosed by very little material. Consequently, the die pad may dislocate due to a weak gripping force. Moreover, during molding, some of the mold compound 114 may leak out via gaps at the junction between an upper and a lower mold to produce flashes. These flashes may affect subsequent die-attaching and wire-bonding operations.

SUMMARY OF THE INVENTION

Accordingly, one object of the present invention is to provide a low cost quad flat non-leaded package that can be used for housing a sensor.

A second object of this invention is to provide a quad flat non-leaded package structure having a die pad resistant to dislocation that can be used to house a sensor.

A third object of this invention is to provide a quad flat non-leaded package structure capable of preventing the penetration of moisture into the internal supporter and die pad that can be used to house a sensor.

To achieve these and other advantages and in accordance with the purpose of the invention, as embodied and broadly described herein, the invention provides a quad flat non-leaded package structure for housing a sensor. The package includes a die pad, a plurality of leads, a die, a plurality of bonding wires, a packaging plastic body and a lid cover. A plurality of supporters are formed near the edges on the backside of the die pad. The plurality of leads are positioned at a well-defined distance away from the four sides of the die pad. The packaging plastic body is formed on the upper surface near the peripheral section of the leads. The space between the die pad and the leads is filled by the packaging plastic material, but the bottom section of the leads and the bottom section of the supporters on the backside of the die pad are exposed. The die is attached to the upper surface of the die pad and is electrically connected to the leads using the bonding wires. The lid cover is placed over the packaging plastic body.

According to the embodiment of this invention, a plurality of supporters are formed near the edges on the backside of the die pad to increase the area of coverage by the packaging material. Hence, the die pad is more firmly gripped, and dislocation of the die pad is less probable. The supporters under the die pad are located far away from the edges of the die pad. Furthermore, all supporters expose just a point on the die pad surface instead of having a step edge around the die pad. Hence, the contact area between the die pad and the packaging material is increased, and the capacity for keeping moisture out is improved. In addition, plastic material instead of ceramic material is used to form the body of the package. Therefore, the fabrication cost of the CMOS sensor can be lowered considerably. Moreover, a flexible releasing film is employed during molding to form a better seal between an upper mold and a lower mold. Consequently, leakage of plastic material from mold junctions can be prevented and flashes can be eliminated.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
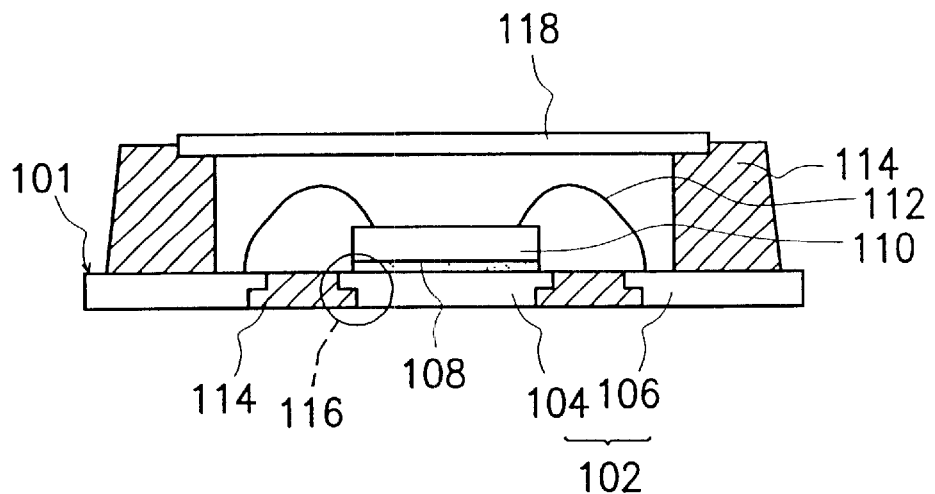
FIG. 1 is a schematic cross-sectional view of a conventional CMOS sensor package.

Reference will now be made in detail to the present preferred embodiments of the invention, examples of which are illustrated in the accompanying drawings. Wherever possible, the same reference numbers are used in the drawings and the description to refer to the same or like parts.

Figure 2:
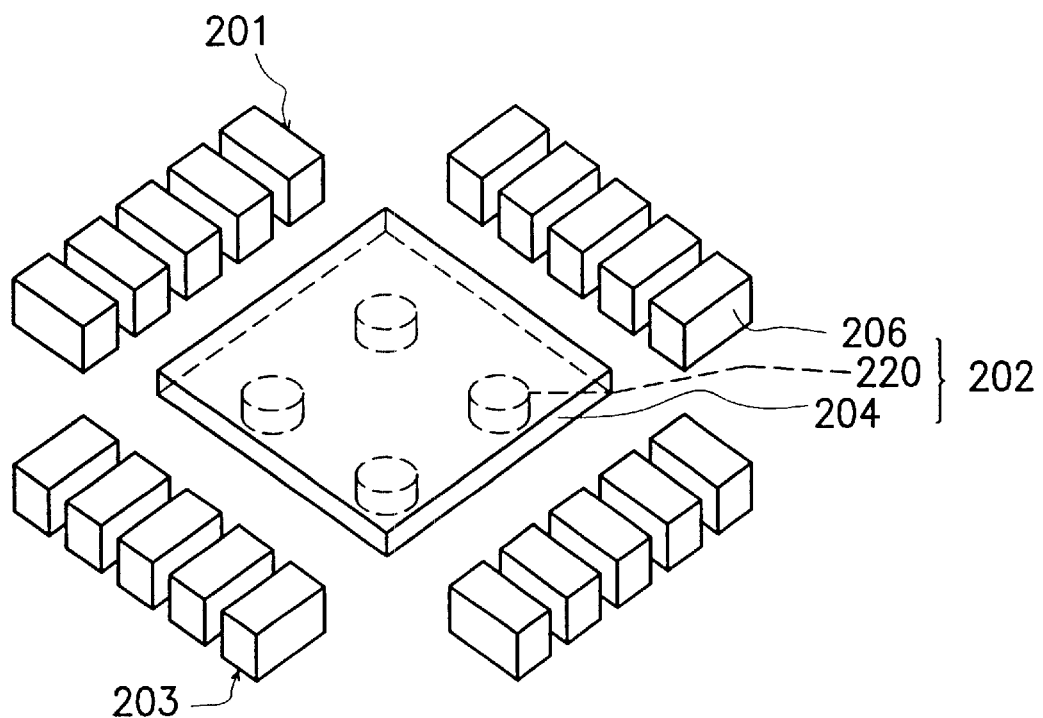
FIG. 2 is a perspective view showing the die pad and surrounding structure of a quad flat non-leaded package for accommodating a sensor according to this invention.

FIG. 2 is a perspective view showing the die pad and surrounding structure of a quad flat non-leaded package for accommodating a sensor according to this invention. A quad flat non-leaded package is a chip scale package (CSP) that uses a lead frame as a carrier. Because a leadless chip scale package has the advantage of having a shorter signal transmission path and therefore producing less signal attenuation, the leadless CSP is the favorite package type for most low pin count semiconductor devices.

As shown in FIG. 2, the package has a lead frame 202 with a front surface 201 and a back surface 203. The package also includes a die pad 204 and a plurality of leads 206. A plurality of supporters 220 are also formed near the outer edges of the die pad 204 on the back surface 203. The supporters 220 are formed, for example, by half-etching or coining. The lead frame 202 can be made from a copper alloy such as alloy 194, C7025, KLF125 or EFTEC or a nickel iron alloy such as alloy 42. The lead frame 202 can also be electroplated to form a coating that improves surface properties such as anti-corrosion, bondability, molderability and solderability.

FIGS. 3A through 3D are schematic cross-sectional views showing the progression of steps for fabricating the quad flat non-leaded package that encloses a sensor according to this invention.

Figure 3A:
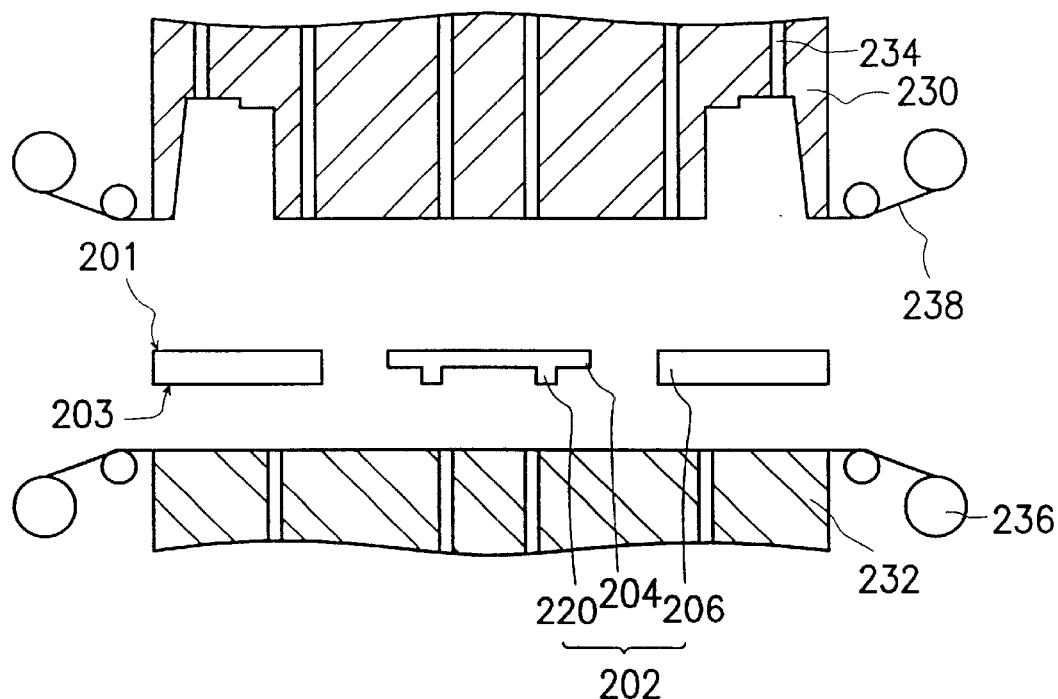
FIGS. 3A through 3D are schematic cross-sectional views showing the progression of steps for fabricating the quad flat non-leaded package that encloses a sensor according to this invention.

As shown in FIG. 3A, the lead frame 202 is placed between an upper mold 230 and a lower mold 232. In other words, the upper mold 230 is positioned over the upper surface 201 of the lead frame 202 while the lower mold 232 is positioned below the lower surface 203 of the lead frame 202. Both the upper mold 230 and the low mold 232 have a plurality of vacuum holes 234. In addition, a set of rollers 236 and a release film 238 are positioned both between the lead frame 202 and the upper mold 230 and between the lead frame 202 and the lower mold 232.

Figure 3B:
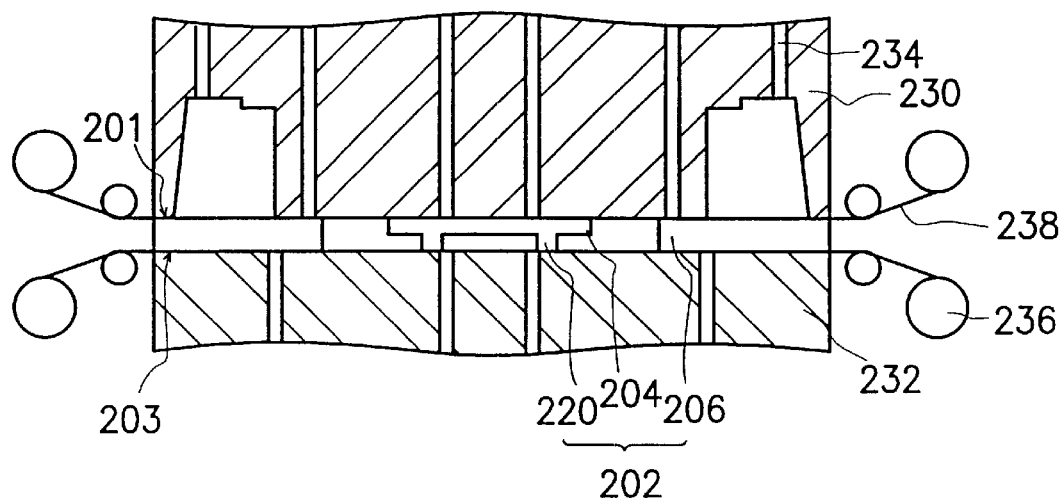

As shown in FIG. 3B, an encapsulation process is conducted. The upper mold 230 moves down to push against the upper surface 201 of the lead frame 202. Is Meanwhile, the lower mold 232 moves up to push against the lower surface 203 of the lead frame 202. Through the vacuum holes 234 on the upper mold 230 and the lower mold 232, the release film 238 is able to attach to the lower surface of the upper mold 230 and the upper surface of the lower mold 232. After each molding, the set of rollers 236 can rotate to bring in a new layer of release film 238. The placement of a release film 238 in the junction between the mold and the lead frame 202 can prevent the leakage of mold compound from the upper surface 201 and the lower surface 203 of the lead frame 202. Hence, the release film 238 actually serves as a sealant that prevents the formation of flashes in the package.

Figure 3C:
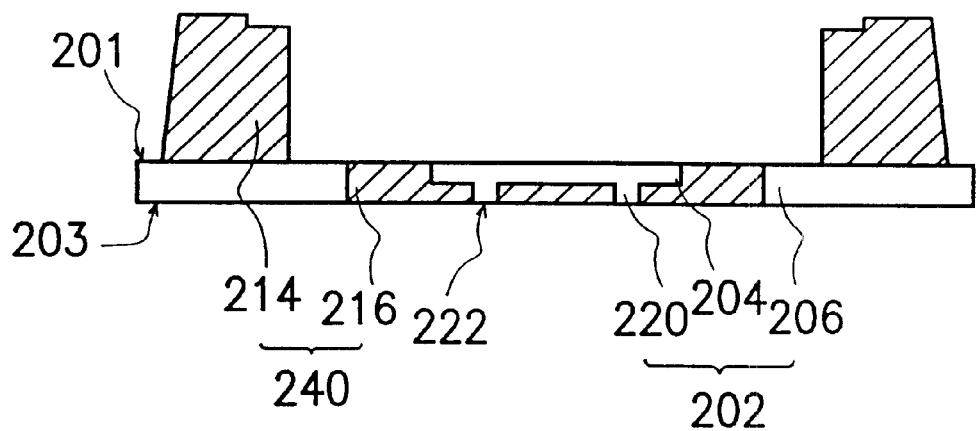

As shown in FIG. 3C, molding is conducted by injecting a plastic material 214. The plastic material 214 is deposited on the surface 201 near the edges of the lead frame 202. The plastic material 214 also fills the gap between the die pad 204 and the leads 206 but exposes the bottom section 222 of the supporters 220 of the die pad 204. The exposed supporters 220 are close to the periphery of the die pad 204 and have a circular section. These supporters 220 increase the overall contact area between the die pad 204 and the plastic material 214.

The supporters 220, unlike a conventional package structure, do not have a step structure. Hence, moisture can only enter by way of the supporters 220 and the edges of the die pad 204. If the supporters 220 are positioned farther away from the edges of the die pad 204, the package is less sensitive to the moisture level. Furthermore, the die pad 204 will be gripped more firmly when the contact area between the plastic material 214 and the die pad 204 is increased. Ultimately, the die pad 204 can dislocate less readily.

Figure 3D:
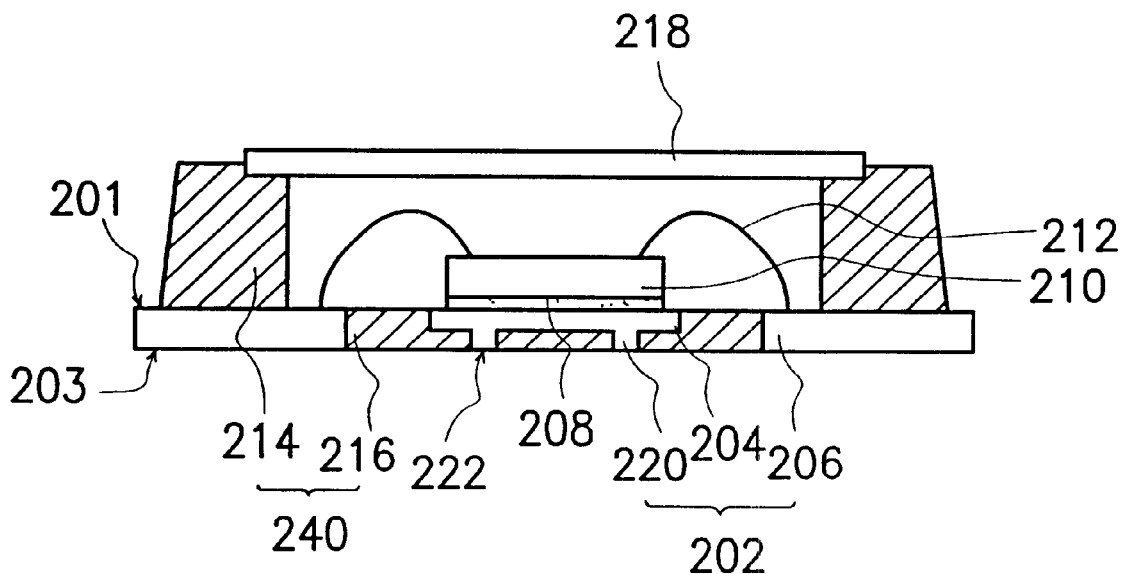

As shown in FIG. 3D, a die 210 such as a complementary metal-oxide-semiconductor (CMOS) sensor is attached to the upper surface 201 of the lead frame 202 via an adhesion layer 208. The adhesion layer 208 can be a layer of silver paste, for example. The die 210 is electrically connected to the leads 206 by bonding wires 212. The bonding wires 212 can be gold or aluminum wires. Finally, a lid plate 218 is put on top of the packaging plastic material 214. The lid plate 218 can be a transparent glass plate, a transparent acrylic board or a transparent plastic board, preferably a material that can increase light-collimating capacity. By using plastic instead of ceramic to form the body of the package, the manufacturing cost of the CMOS sensor can be lowered considerably.

In Summary, the Advantages of the Invention Include

1. A plurality of supporters are formed near the edges on the backside of the die pad to increase the area of coverage by the packaging material. Hence, the die pad is more firmly gripped, and dislocation of the die pad is less probable.

2. The supporters under the die pad are located far away from the edges of the die pad. Furthermore, all supporters expose just a point on the die pad surface instead of having a step edge around the die pad. Hence, the contact area between the die pad and the packaging material is increased, and the ability of the package to prevent moisture penetration is improved.

3. In addition, plastic material instead of ceramic material is used to form the body of the package. Hence, the fabrication cost of the CMOS sensor can be lowered considerably.

4. A flexible releasing film is employed during molding to form a better sealing between an upper mold and a lower mold. Consequently, leakage of plastic material from mold junctions can be prevented and flashes can be eliminated.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A quad flat non-leaded package structure for housing a sensor, comprising:

a die pad having a plurality of supporters, wherein the supporters are located at a distance away from the edges at the backside of the die pad;

a plurality of leads, wherein the leads are at a suitable distance away from the edges of the die pad;

a packaging body made from a packaging material formed on a top surface of the leads, wherein the packaging material further fills a gap between the die pad and the leads but exposes a bottom section of the supporters on the die pad and a bottom surface of the leads;

a die attached to an upper surface of the die pad;

a plurality of bonding wires for connecting the die and the leads electrically; and a lid plate over the packaging body.

2. The package structure of claim 1, wherein material forming the packaging body and the packaging material includes plastic.

3. The package structure of claim 1, wherein the packaging body and the packaging material are formed by molding.

4. The package structure of claim 3, wherein the packaging body and the packaging material are formed in a molding process that also utilizes a release film.

5. The package structure of claim 1, wherein the lid plate includes a transparent glass plate.

6. The package structure of claim 1, wherein the lid plate includes a transparent acrylic board.

7. The package structure of claim 1, wherein the lid plate includes a transparent plastic plate.

8. The package structure of claim 1, wherein the die is attached to the die pad by the application of a layer of adhesive material.

9. The package structure of claim 1, wherein the die includes a complementary metal-oxide-semiconductor (CMOS) sensor chip.

10. A quad flat non-leaded package structure for housing a sensor, comprising:

a die pad having a plurality of supporters, wherein the supporters are located at a distance away from the edges at the backside of the die pad;

a plurality of leads, wherein the leads do not directly contact he edges of the die pad;

a packaging body made from a packaging material formed on a top surface of the leads, wherein the packaging material further fills a gap between the die pad and the leads;

a die attached to an upper surface of the die pad;

a plurality of bonding wires for connecting the die and the leads electrically; and a lid plate over the packaging body, wherein the lid plate comprises a transparent acrylic board.

11. The package structure of claim 10, wherein the material forming the packaging body and the packaging material includes plastics.

12. The package structure of claim 10, wherein the die is attached to the die pad by the application of a layer of adhesive material.

13. The package structure of claim 10, wherein the die includes a complementary metal-oxide-semiconductor (CMOS) sensor chip.

* * * * *